United States Patent [19]

Varteresian et al.

[11] Patent Number: 4,661,834
[45] Date of Patent: Apr. 28, 1987

[54] SEMICONDUCTOR STRUCTURES AND MANUFACTURING METHODS

[75] Inventors: Michael G. Varteresian, Watertown; S. Robert Steele, Sudbury, both of Mass.

[73] Assignee: Raytheon Company, Lexington, Mass.

[21] Appl. No.: 810,901

[22] Filed: Dec. 20, 1985

Related U.S. Application Data

[63] Continuation of Ser. No. 679,680, Dec. 10, 1984, abandoned.

[51] Int. Cl.$^4$ ............................................. H01L 29/06
[52] U.S. Cl. ......................................... 357/56; 357/81; 357/68; 357/71
[58] Field of Search ...................... 357/56, 65, 68, 81, 357/71

[56] References Cited

U.S. PATENT DOCUMENTS

| 3,323,358 | 6/1967 | Fraioli | 357/65 |
| 3,387,359 | 6/1968 | Dale | 357/65 |
| 3,464,104 | 9/1969 | Tonner | 357/65 |
| 3,878,553 | 4/1975 | Sirles | 357/68 |
| 3,896,473 | 7/1975 | Dilorenzo | 357/56 |
| 4,003,073 | 1/1977 | Helda | 357/68 |
| 4,189,342 | 2/1980 | Kock | 357/69 |
| 4,202,001 | 5/1980 | Reichert | 357/68 |
| 4,227,298 | 10/1980 | Keeling et al. | 357/65 |

FOREIGN PATENT DOCUMENTS 0093248  7/1980  Japan ................................... 357/76

Primary Examiner—Andrew J. James
Assistant Examiner—Mark Prenty

Attorney, Agent, or Firm—Denis G. Maloney; Richard M. Sharkansky

[57] ABSTRACT

A plurality of microwave semiconductor devices is provided by plating a thin conductive layer on a surface of a wafer of semiconductor material, masking selected portions of the thin conductive layer, and plating unmasked portions of the thin conductive layer to form a thicker, apertured support layer with the apertures in the support layer providing a thin contact. After forming the thicker, apertured support layer, substantial portions of the semiconductor material are removed to form the semiconductor devices as a plurality of mesa shaped diodes, with each one of the semiconductor mesa shaped diodes being formed on a corresponding one of the thin contacts, and with the plurality of mesa shaped diodes being mutually supported by the support layer and integrally formed thin contacts. Each contact and the support are selectively etched to pattern portions of the support and thin contacts into a frame. Each frame includes an unetched portion of the support, and a plurality of thin tapered fingers formed from first unetched portions of each contact. The tapered fingers mechanically interconnect a second unetched portion of the thin contact to the frame. Thus, a portion of the support in combination with the plurality of finger portions provides a frame to hold together individual ones of such diodes of each set. A set of diodes with the frame interconnecting such diodes to the support layer is then disposed for bonding into a heat sink surface. The thin contacts of the individual diodes in the set are thermocompression bonded to the heat sink surface, and the frame structure is then mechanically removed leaving the diodes in such set bonded to the heat sink surface.

1 Claim, 15 Drawing Figures

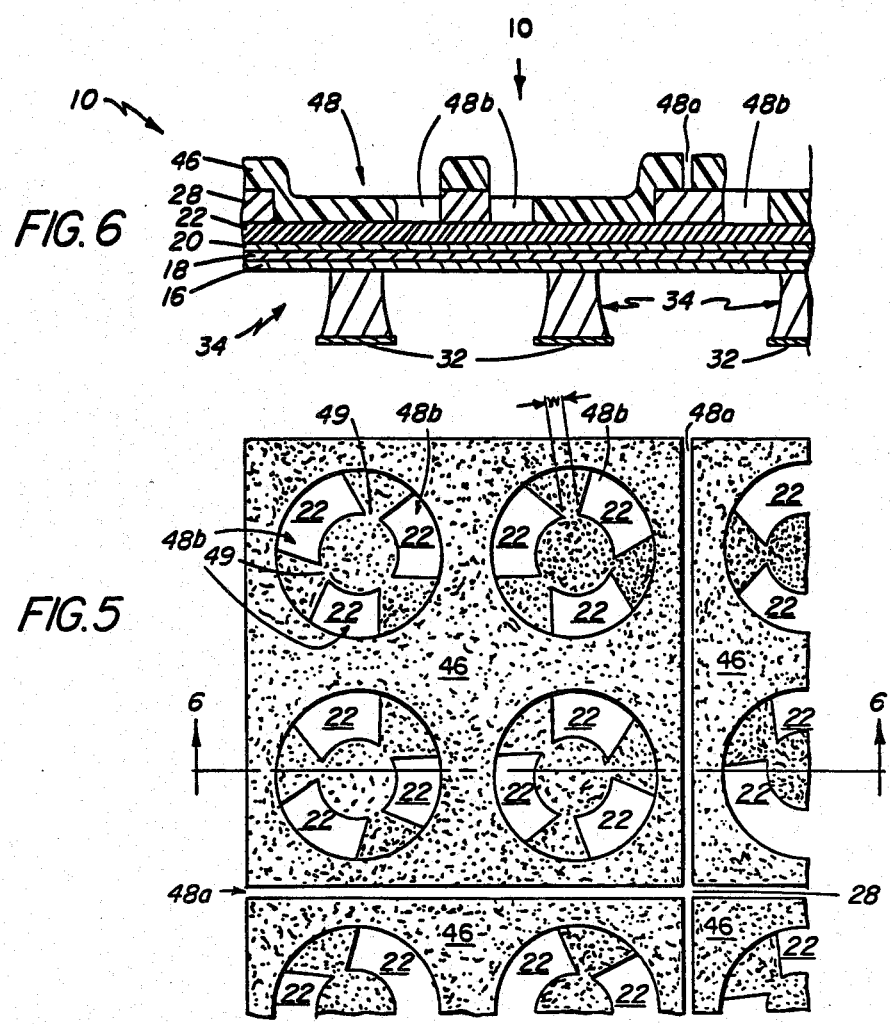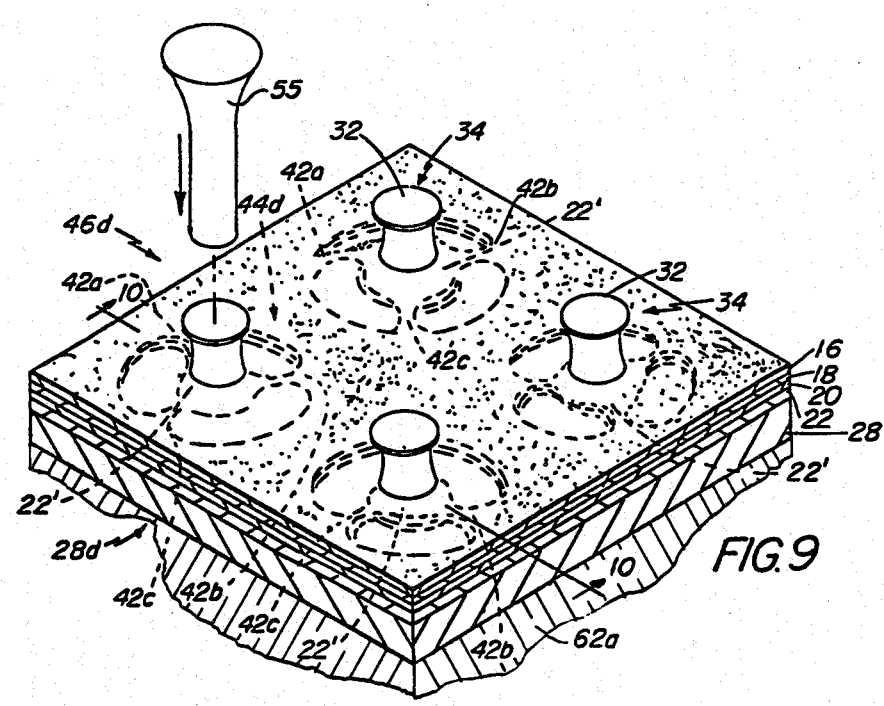

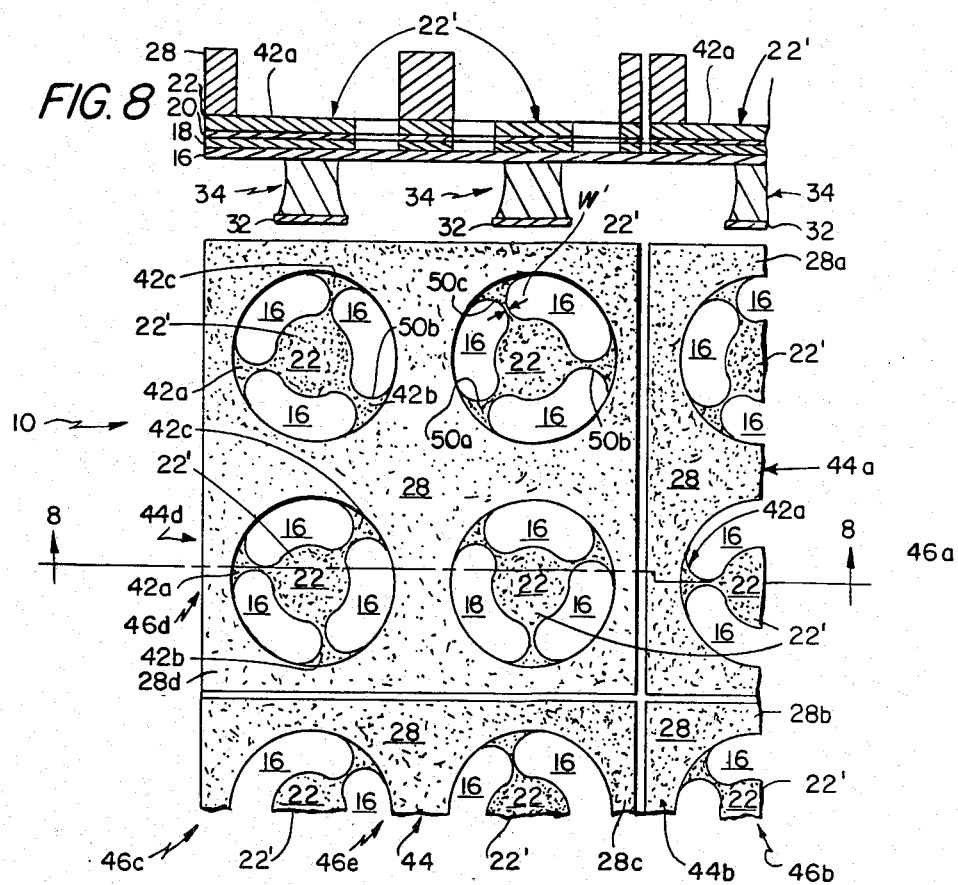

SEMICONDUCTOR STRUCTURES AND MANUFACTURING METHODS

This application is a continuation of application Ser. No. 679,680 filed Dec. 10, 1984, now abandoned.

BACKGROUND OF THE INVENTION

This invention relates generally to semiconductor devices and more particularly to semiconductor devices adapted to operate with high levels of microwave power.

As is known in the art, it is frequently desirable to use microwave diodes in a variety of high power applications. When used in high power applications, it is generally necessary to extract from the diode the heat generated by the diode in operating at a high power output and in maintaining an acceptable direct current to microwave frequency conversion efficiency. To accomplish this, it is frequently desirable to use a plurality of individual mesa shaped diodes to distribute the heat generated among the diodes, with the individual ones of such mesa shaped diodes having a total area equal to the one of an equivalent single mesa shaped diode. When used in such applications, the plurality of mesa shaped diodes is generally mounted to a pedestal shaped common heat sink to conduct heat away from the plurality of diodes. A technique used to mount a plurality of individual diodes adapted to operate at X-band is to individually bond each of such diodes to the common heat sink. This is a relatively difficult process for relatively small X-band diodes, however, when the diodes are designed to operate at millimeter wavelengths, they are so small that mounting them individually to the common heat sink becomes an exceedingly difficult task.

As is also known in the art, an alternate technique for mounting a plurality of diodes includes forming a thick plated heatsink on a substrate and subsequently etching the mesa shaped diodes from portions of the substrate. The substrate is diced into a plurality of sets of diodes with each one of such sets having a portion of the thick plated heat sink. The heat sink side of the set of diodes is mounted to the common, pedestal shaped heat sink. This thick plated heat sink generally provides a thermally conductive means for carrying heat away from each of the diodes in the set. Further, after dicing, each thick plated heat sink supports a set of diodes during additional processing steps, such as final packaging. However, a thick plated heat sink is undesirable when the material of the common, pedestal shaped heat sink has a higher thermal conductivity than the material of the thick plated heat sink, such as when a gold plated diamond slab is used to provide part of the common heat sink. In such a case, it is thus desirable to reduce the thickness of the plated heat sink in order to minimize the thermal resistance of the diode and to thereby increase the flow of heat from the diode to the common pedestal shaped heat sink. However, as previously mentioned, a thick plated heat sink is generally required to provide structural integrity to the wafer after the diodes have been formed into mesas, and to support individual ones of such diodes in each set for final packaging because after etching the substrate to form the mesa shaped diodes, the mesa shaped diodes are supported only by the gold plated heat sink. Therefore, if the heat sink is too thin, the structure supporting the set of mesa shaped diodes may flex, bend or crease making the set of diodes difficult to handle during the subsequent photolithographic and processing steps and may also result in damage to the diodes with a resulting lower yield of acceptable devices.

SUMMARY OF THE INVENTION

In accordance with the invention, a plurality of mesa shaped diodes, each having a thin bottom contact on one surface thereof, is supported by a support structure having a plurality of apertures, each aperture exposing the thin bottom contact of a corresponding one of the diodes. Each thin bottom contact and the support structure are patterned into a plurality of sets of individual mesa shaped diodes with first unetched portions of the bottom contacts of the diodes in each set thereof being connected together by a frame. The frame includes: an unetched portion of the support structure; and at least one thin tapered finger formed from second unetched portions of the bottom contact; with the first unetched portion of each bottom contact providing a diode contact for the mesa shaped diode. The thin tapered finger is integrally formed with the diode contact and the unetched portion of the support structure. The frame supported set of mesa shaped diodes is then disposed for bonding onto a suitable heat sink surface with the thin diode contact side mounted down on the heat sink surface. With the frame supporting the set of diodes, the individual mesa shaped diodes are then thermo-compression bonded to the heat sink surface. After bonding, the frame is removed. With such an arrangement, the frame allows for handling a set of mesa shaped diodes and thereby facilitates bonding of individual ones of the mesa shaped diodes to the heat sink. Further, each individual mesa shaped diode of a set of such diodes has a plated diode contact which can be made sufficiently thin to enhance thermal transfer properties between such diodes and the heat sink, and to allow for easy removal of the frame structure after bonding. The diode device will thus have a lower thermal resistance than diode devices having a thicker plated diode contact, a feature particularly desirable when the diode device is mounted on a material having a higher thermal conductivity than that of the plated diode contact. Further still, the support structure provides the necessary structural integrity to the plurality of mesa diodes during the subsequent processing of the wafer.

BRIEF DESCRIPTION OF THE DRAWINGS

For a better understanding of the invention, reference is made to the following detailed description of the drawings wherein:

FIG. 5 is a plan view of the wafer shown in FIG. 4, with a photoresist mask thereon;

FIG. 6 is a cross-sectional view of FIG. 5 taken along line 6—6;

FIG. 7 is a plan view of the bottom of the wafer after etching to provide a frame in accordance with the invention;

FIG. 8 is a cross-sectional view of FIG. 7 taken along line 8—8;

FIG. 9 is an isometric view of a multi-mesa diode device constructed in accordance with FIGS. 1-8;

DESCRIPTION OF THE PREFERRED EMBODIMENT

Construction of a multi-mesa semiconductor device having a frame attaching individual ones of diodes thereto, in accordance with the teachings of the present invention will be initially described in conjunction with FIGS. 1 through 6.

Figure 1:
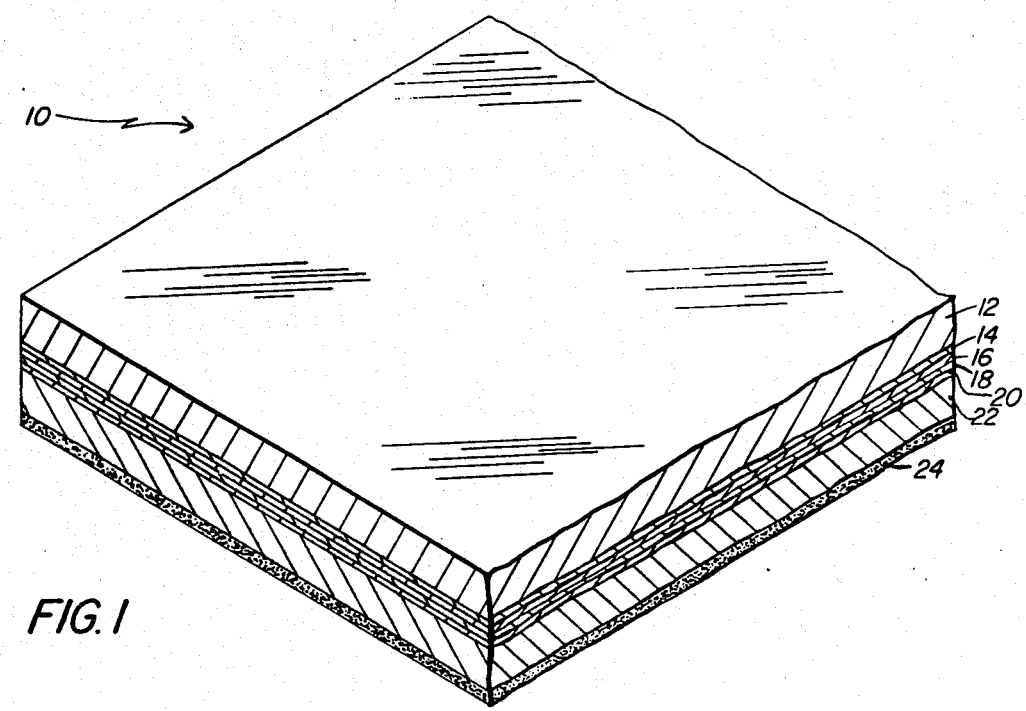
FIGS. 1-4 are a series of fragmentary isometric cross-sectional views showing steps in the construction of a multi mesa diode device having a frame for holding together such multimesa diode in accordance with the invention.

Referring first to FIG. 1, a wafer 10 is shown to include a substrate 12, here N+ type gallium arsenide (GaAs) and an active layer 14 of epitaxially grown semiconductor GaAs. Active layer 14 may have one of many different doping density profiles depending upon the particular application for the diode, here, for example, a doping density profile described in a U.S. Pat. No. 4,160,992, issued July 10, 1979 and assigned to the assignee of this invention is used. A first metal layer 16, here of platinum (Pt), is here sputtered upon the active layer 14 to a thickness in the range of 100 Angstroms to 200 Angstroms (A). A second metal layer 18, here of titanium (Ti), is then sputtered over the platinum layer 16 to a thickness of 1000 A to 2000 A. Titanium is the preferred material although tungsten, hafnium, or other refractory metals may be used for layer 18. Upon the layer 18 a layer 20 of highly conductive gold is here sputtered to a thickness in the range of 2000 A to 3000 A. Next, a thermally and electrically conductive contact layer 22, here of gold, is plated to a thickness in the range of one to two microns over the sputtered gold layer 20. A masking layer 24 here of photoresist is then deposited on the plated gold contact layer 22, as shown.

Figure 2:
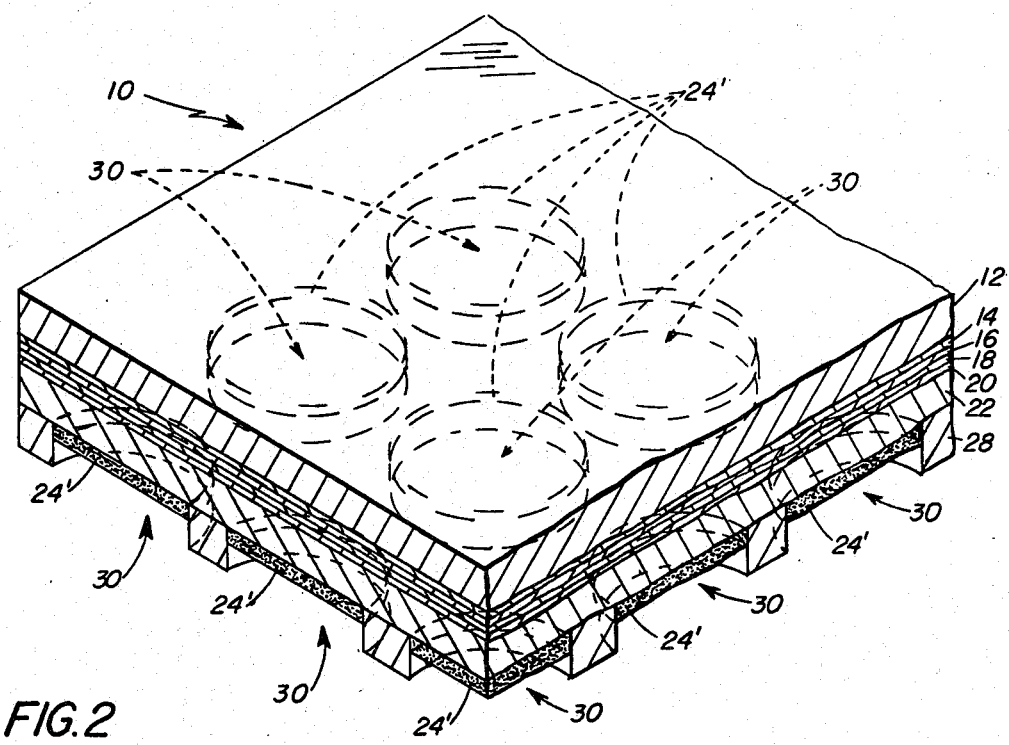

Referring now to FIG. 2, the masking layer 24 is masked, developed and chemically etched away in selected areas using well-known photoresist techniques to leave disc shaped portions 24' thereof remaining over selected regions of the plated contact layer 22, as shown. The unmasked portions of the gold contact layer 22 are plated with gold, here to a thickness of ten microns to form an aperture support layer 28.

Figure 3:
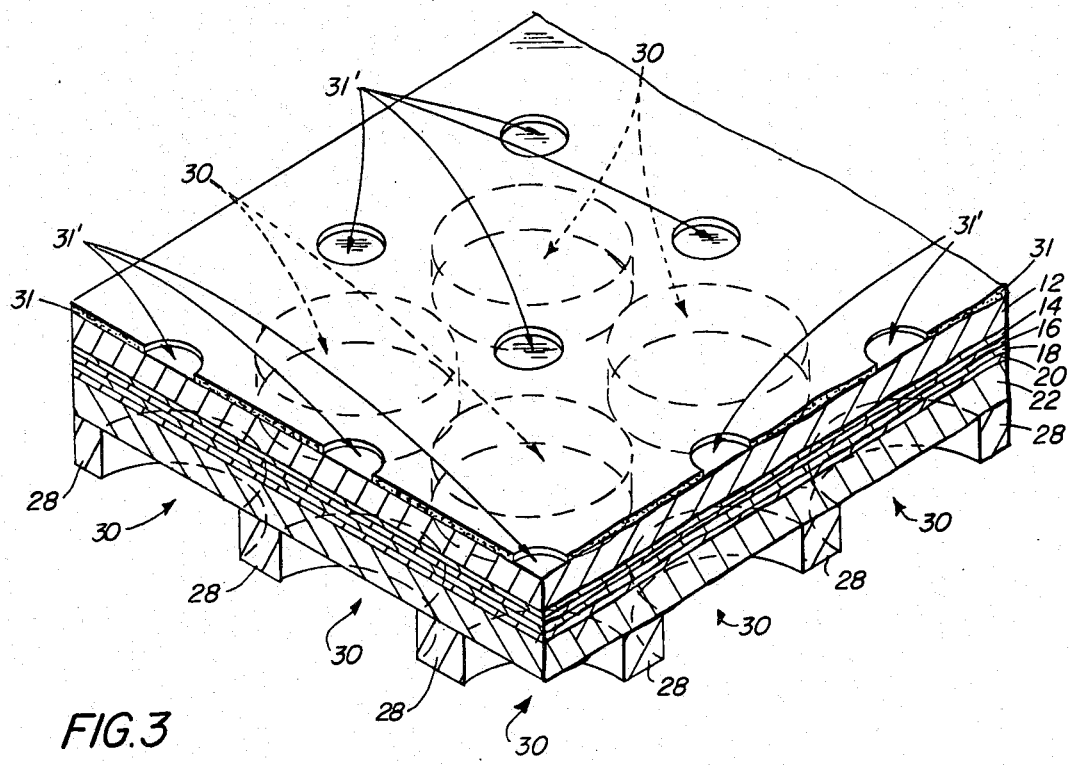
Figure 4:
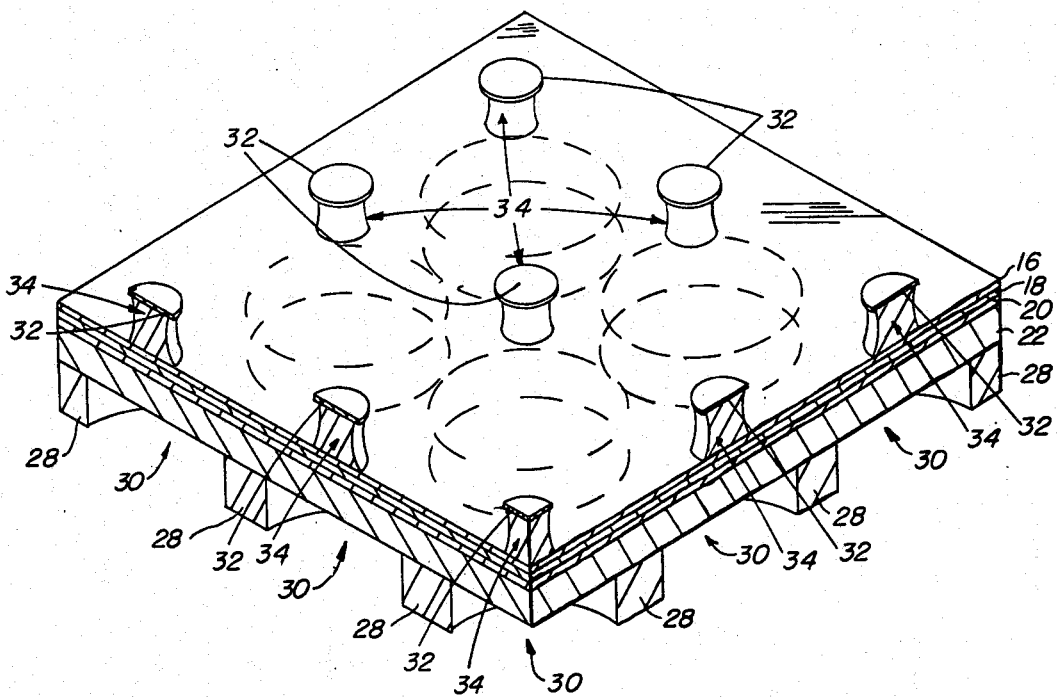

Referring now to FIG. 3, the disc shaped regions 24' (FIG. 2) of masking layer 24 are removed, leaving the apertured support layer 28. It is noted that the gold contact layer 22 remains at the original thickness but the support layer 28 is made sufficiently thick to provide structural integrity for the diodes to be formed in wafer 10 in a manner to be described hereinafter. Suffice it to say here, however, that the support layer 28 has formed therein a plurality of apertures 30 corresponding to areas where the disc shaped portions 24' of the masking layer 24 (FIG. 2) were provided. The plurality of apertures 30 define selected areas of the contact layer 22. The substrate 12 is next thinned to a predetermined thickness and a masking layer 31 is patterned into a plurality of apertures 31'. Apertures 31 define areas of top contacts of the mesa shaped diodes 34 (FIG. 4). The mask used to pattern masking layer 31 is here aligned with the aperture 30 in the support 28. The step of forming the apertures 31' in alignment with the apertures 30 is accomplished by use of a front to back alignment of the top diode contact mask (not shown) used to provide the apertures 31' in masking layer 31 for the diode contacts 32 (FIG. 4). A general front to back alignment procedure as described in U.S. Pat. No. 4,160,992, previously mentioned is here used.

Referring now to FIG. 4, a plurality of first diode contacts 32 are provided on the top of the thinned substrate 12, and a plurality of mesa shaped diodes 34 are formed from the thinned substrate 12 and active layer 14 between the first diode contacts 32 and platinum layer 16, as shown. The plurality of diode contacts 32 are formed by plating each aperture 31' (FIG. 3) after evaporating a suitable contact metallization layer (not shown) with gold forming the aforementioned first diode contacts 32. The plurality of individual mesa diodes 34 are then formed between the top contacts 32 and the platinum layer 16. The individual mesa diodes 34 are formed by chemically etching away portions of the thinned substrate 12 (previously thinned to a predetermined thickness) and active layer 14 between the diode contact 32 and the platinum layer 16, as shown. Thus, each mesa shaped diode 34 is formed from the thinned substrate 12 and active layer 14 and has formed on a bottom surface thereof a thin gold contact layer 22, and has formed on a top surface thereof a first diode contact 32. Further, the wafer 10 of such mesa shaped diodes 34 is supported by the support layer 28.

Referring now to FIGS. 5 and 6, a photoresist layer 46 is provided over the support side surface 10' of wafer 10 and is masked and etched away in unmasked locations thereof to provide a frame pattern and dicing mask 48, as shown. Apertures 48a define areas where the wafer is diced into sets of mesa shaped diodes (FIGS. 7-8) and apertures 48b define areas where a frame (FIGS. 7-8) is provided in accordance with the invention.

Referring now to FIGS. 7 and 8, a suitable gold etchant (not shown) is brought into contact with unmasked portions of the gold diode contact 22 (FIGS. 5, 6) and such unmasked portions of the gold diode contact 22 are etched away providing from a first unetched portion of the gold contact layer 22 a smaller gold diode contact 22'. Further, the unmasked portions of the support 28 are here contemporaneously etched into a plurality of support portions, here 28a-28d, to provide a plurality of sets 46a-46d of mesa shaped diodes, each individual one of such diodes having a corresponding one of such gold diode contacts 22'. The gold diode contacts 22' of each one of such mesa shaped diodes 34 are held together by a frame 44a-44d. Each frame 44a-44d includes a plurality of tapered fingers 42a-42c or spider protrusions and a corresponding one of such support portions 28a-28c. The tapered fingers 42a-42c are integrally formed between the support portions 28a-28c and diode contacts 22', and are provided from second unetched portions of the gold contact layer 22. Thus, each one of such integrally formed frames 44a–44d are provided to support and hold together individual ones of such mesa shaped diodes 34, after dicing into a plurality of sets 46a–46d of such diodes, to facilitate handling and packaging of such diodes, in a manner to be described. It is to be noted, that presently, due to the process limitations of photolithographic technology, the width w in the masking layer 48 (FIGS. 5, 6, here of photoresist) of thin tapered finger mask portions 48a–48c used to mask selected underlying portions of the gold contact layer 22 is selected to be approximately 1 mil at portions 49 (FIGS. 5, 6). Using techniques well-known in the art, the gold contact layer 22 is selectively undercut by letting the gold etchant (not shown) remain in contact with gold contact layer 22 to continue etching the gold contact layer 22 until the width w' of such tapered fingers 42a–42c under portions 49 of the mask 48 (FIGS. 5, 6) and at the interconnection at points 50a–50c of such fingers 42a–42c to the support portion of the frame 44a–44d is within the range of 0.3 mils to 0.6 mils. It has been found that a width w' of approximately 0.4 mil is generally preferable for use with mesa shaped diodes having thin gold contact layers 22 of approximately 2.0 microns. In general, the narrower the fingers at such points 50a–50c, the more fragile the structure, and the wider the fingers at such point 50a–50c, the greater the force which is required to remove the corresponding frame 44a–44c from the corresponding set 46a–46d of mesa shaped diodes, and also the more probable that some damage may be imparted to the individual mesas 34 or the diode contacts 22' during removal of the frame 44a–44d. After selective etching of the gold contact layer 22, the titanium layer 18 is etched in areas thereof, masked by the contact layer 22 using a 10% hydrofluoric acid solution for approximately 15 seconds. It is to be noted that the platinum layer 16 is not etched, but due to the relatively brittle characteristics of platinum, the platinum layer 16 may shred or flake, as a result of the above etching steps. Therefore, after etching of the contact layer 22, an acetone spray is applied to the back side of the wafer 10 to clean the surface, as is known in the art, and to permit any of such shreds or flakes (not shown) of platinum, to float away.

Figure 10:
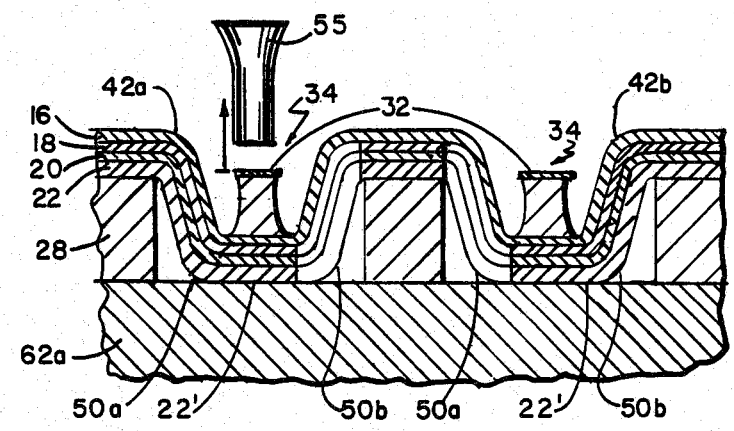
FIG. 10 is a cross-sectional view of FIG. 9 taken along line 10—10 showing a bonding tool for bonding individual mesa shaped diodes of the multi-mesa diode device in accordance with the invention.
Figure 11:
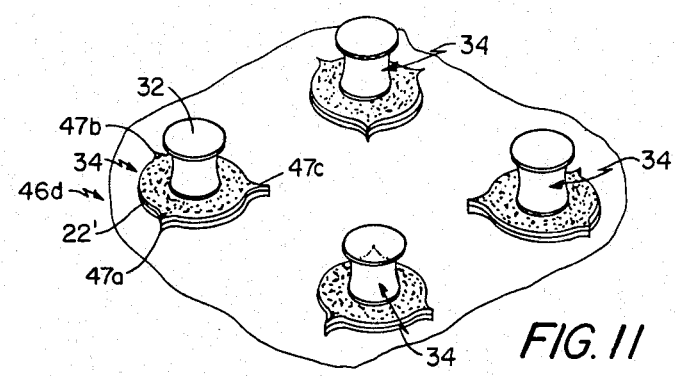
FIG. 11 is an isometric view of the multi-mesa diode shown in FIG. 9 with the frame removed in accordance with the invention.
Figure 12A:
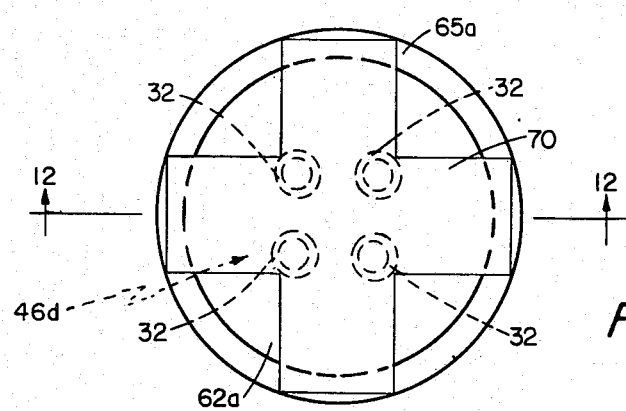
FIG. 12A is a cross-sectional view of FIG. 12 taken along line 12A—12A showing a multi-mesa diode device mounted in a ceramic ring package in accordance with the invention.
Figure 12:
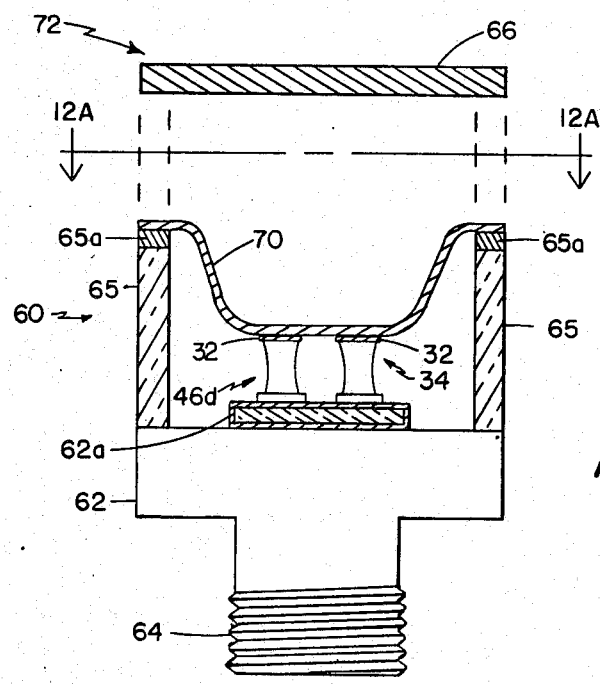
FIG. 12 is a top view of a multi mesa diode device mounted in a ceramic ring package in accordance with the invention.

Referring now to FIGS. 9, 10, 11, 12, 12A, each one of such mesa shaped diodes 34 of set 46d has attached thereto on a bottom surface thereof a corresponding diode contact 22' and such diode contact 22' is connected to a corresponding frame, here frame 44d, via the thin tapered fingers 42a–42d, such fingers here being tapered inwardly, as shown. The set 46d of mesa shaped diodes with its corresponding frame 44d is shown disposed on a portion of a heat spreader 62a. The heat spreader 62a, here a gold plated diamond slab, is part of a pedestal shaped heat sink 62, and the heat spreader 62a and heat sink 62 are part of a diode package 60 (FIG. 12). The diode package 60 also includes a threaded support 64 supporting the heat sink 62, a ceramic ring spacer 65, having a conductive rim 65a, supported by pedestal shaped heat sink 62, and a conductive lid 66 here shown removed from the package 60. As shown in FIGS. 9 and 10, a bonding tool 55 is brought into contact with each one of such mesas 34 of the set 46d and a conventional thermocompression bond is provided by permitting the contact 22' of each mesa diode to be brought into contact with the surface of the heat spreader 62a. The temperature of the heat spreader is raised to a predetermined temperature generally around 300° C., and in response to the pressure exerted by the bonding tool 55 and the elevated temperature of the surface of heat spreader 62a, the diode contact side of each mesa is bonded to the heat spreader 62a. As shown in FIG. 11, the set 46d has the frame 44d removed here by use of tweezers or a needle to lift the frame 44d, leaving the individual mesa shaped diodes bonded to the thermal spreader 62, as shown. In a preferred mode, the thin tapered finger portions 42a–42d at points 50a–50d (FIG. 7) thereof are also thermocompression bonded to the heat spreader 62a prior to removal of the frame 44d from the set of mesa shaped diodes 46d. This is done in order to prevent portions of the fingers or diode contact layer 22' from pulling upward and potentially shorting out the mesa. With this preferred procedure, the frame 44d is easily removed from the set 46d of mesa shaped diodes. The frame 44d is removed without any significant damage to the mesas 34 or the diode contacts 22' if the thin tapered fingers 42a–42c which hold each diode contact 22' to the frame 44d are fabricated to have a width w' within the range of 0.3 mil to 0.6 mil when the thickness of the bottom contact is 2 microns, as described above. The frame structure 44d provides sufficient integrity and rigidity to the set 46d of such individual mesa diodes to permit further handling operations such as the bonding operation described above without damage to the mesa or without unnecessary difficulty. After removal of the frame 44d, portions 47a–47c of the thin tapered fingers 42a–42b remain bonded to the heat spreader 62a as shown in FIG. 11. If the portions 50a–50c were not bonded to the heat spreader 62a prior to removal of the frame, as described above, such remaining portions 47a–47c after removal of the frame are then thermo-compression bonded to the heat spreader 62a to prevent such portions from accidentally touching a portion of a mesa 20 and therefore creating a short circuit. An integrally formed cross pattern 70 (FIG. 12A) is thermocompression bonded to the top contacts 22 of the mesas 20 and is also thermocompression bonded to the conductive rim 65a of the ceramic ring spacer 65 and conductive lid 66 to provide a second contact for the packaged diode device 72.

Figure 13:
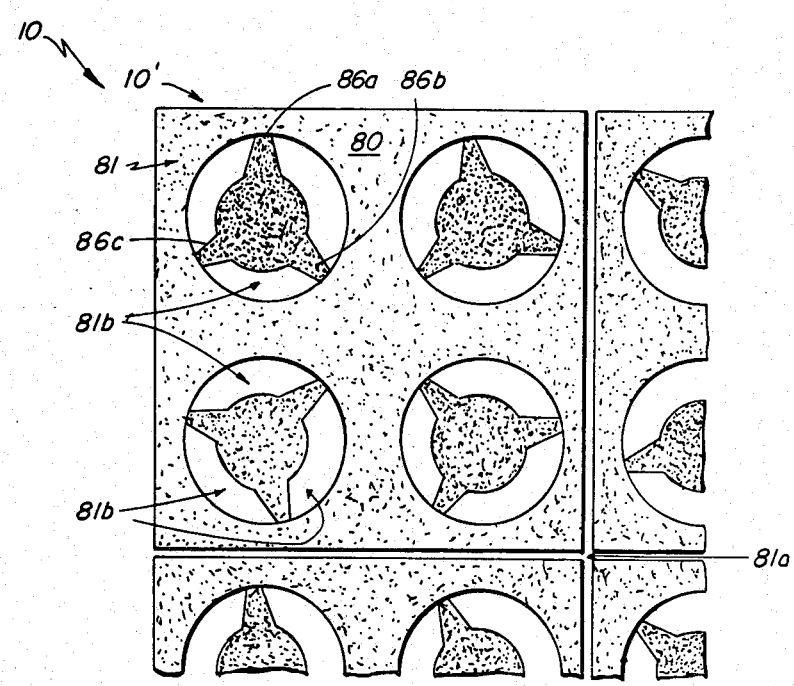
FIG. 13 is a top view of a mask pattern for an alternate frame structure.
Figure 14:
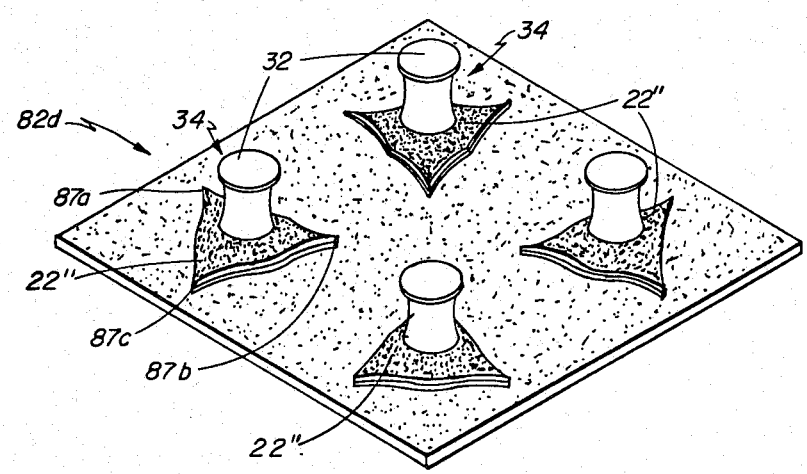
FIG. 14 is an isometric view of a multi-mesa diode device constructed in accordance with FIGS. 1-4 and FIG. 13 having a frame structure for holding together such multi-mesa diodes in accordance with an alternate embodiment of the invention.

Referring now to FIGS. 13 and 14, a masking layer 80 (FIG. 13) is formed over support side surface 10' of wafer 10 and is masked, developed and etched away in unmasked locations thereof to provide an alternate frame pattern and dicing mask 81. Apertures 81a define areas where the wafer 10 is diced into sets of mesa shaped diodes (FIG. 14) and apertures 81b define areas where a frame (not shown) is provided in accordance with the invention. As shown in FIG. 13, masking portions 86a–86c used to form a plurality of thin tapered fingers (not shown) to hold the diodes to the frame as described above, here have tapered fingers which are tapered outwardly from the contacts 22. In a similar manner as previously described, such mask pattern 80 is used to etch a frame (not shown) from selected portions of the contacts 22 to provide after removal of such frame the set 82d shown in FIG. 14. Here, however, since masking portions 86a–86c used to provide the tapered fingers (not shown) are outwardly tapered, it is easier especially for relatively small mesa shaped diodes to bond portions 87a–87c of the fingers (not shown) to the heat spreader 62 prior to disassociation of the frame (not shown) from contact 22" formed on the mesa shaped diodes, as described above. In all other aspects, the frame (not shown) and mounting method are identical to that described in conjunction with FIGS. 1–12.

Having described preferred embodiments of the invention, it will now be apparent to one of skill in the art that other embodiments incorporating these concepts may be used. It is felt, therefore, that this invention should not be limited to the disclosed embodiment but rather should be limited only by the spirit and scope of the appended claims.

What is claimed is:

1. A semiconductor device comprising:
 a heat spreader surface;
 at least one mesa shaped diode having a first electrode contact disposed on a first portion of said mesa shaped diode and a thermally conductive layer having a thickness in the range of 1 to 2 microns disposed on a second, opposite portion of the mesa shaped diode; and
 wherein said thermally conductive layer is bonded to said heat spreader surface and said thermally conductive layer has small finger-like portions emanating from peripheral portions of the thermally conductive layer.

* * * * *